(12) United States Patent
Maeda et al.

(10) Patent No.: US 8,946,827 B2
(45) Date of Patent: Feb. 3, 2015

(54) SEMICONDUCTOR DEVICE

(71) Applicant: Renesas Electronics Corporation, Kanagawa (JP)

(72) Inventors: Satoshi Maeda, Kanagawa (JP); Maya Ueno, Kanagawa (JP)

(73) Assignee: Renesas Electronics Corporation, Kanagawa (JP)

( * ) Notice: Subject to any disclaimer, the term of this patent is extended or adjusted under 35 U.S.C. 154(b) by 34 days.

(21) Appl. No.: 13/864,464

(22) Filed: Apr. 17, 2013

(65) Prior Publication Data

US 2013/0285207 A1  Oct. 31, 2013

(30) Foreign Application Priority Data

Apr. 26, 2012  (JP) ................. 2012-101541

(51) Int. Cl.
*H01L 27/11* (2006.01)
*H01L 49/02* (2006.01)
*H01L 27/08* (2006.01)
*H03K 3/011* (2006.01)

(52) U.S. Cl.
CPC ............ *H01L 28/20* (2013.01); *H01L 27/0802* (2013.01); *H03K 3/011* (2013.01)
USPC .......................................... 257/379; 257/538

(58) Field of Classification Search
CPC ....................................... H01L 23/647
USPC ................................... 257/379, 538
See application file for complete search history.

(56) References Cited

U.S. PATENT DOCUMENTS 5,218,225 A * 6/1993 Zanders ......................... 257/538
5,994,758 A   11/1999 Hayashi

FOREIGN PATENT DOCUMENTS

JP   06-097368 A   4/1994
JP   10-189875 A   7/1998

* cited by examiner

*Primary Examiner* — Mark Prenty
(74) *Attorney, Agent, or Firm* — Mattingly & Malur, PC

(57) ABSTRACT

Disclosed is a semiconductor device. The semiconductor device includes a functional circuit having a resistor formed by a plurality of polysilicon resistors, and in which the property of the functional circuit can be adjusted by trimming the resistor, and in which the polysilicon resistors are coupled in series or in parallel to each other and arranged in a direction perpendicular to one side of the semiconductor device.

8 Claims, 11 Drawing Sheets

FIG. 3B

Roco

NF —⟋⟍256R⟋⟍128R⟋⟍64R⟋⟍32R⟋⟍16R⟋⟍8R⟋⟍4R⟋⟍2R⟋⟍R— VSS

VDD — 31 — 32 — 33 — N1
34 — 35 — N2
NF
Roco
Iref
VSS

30
VREF2

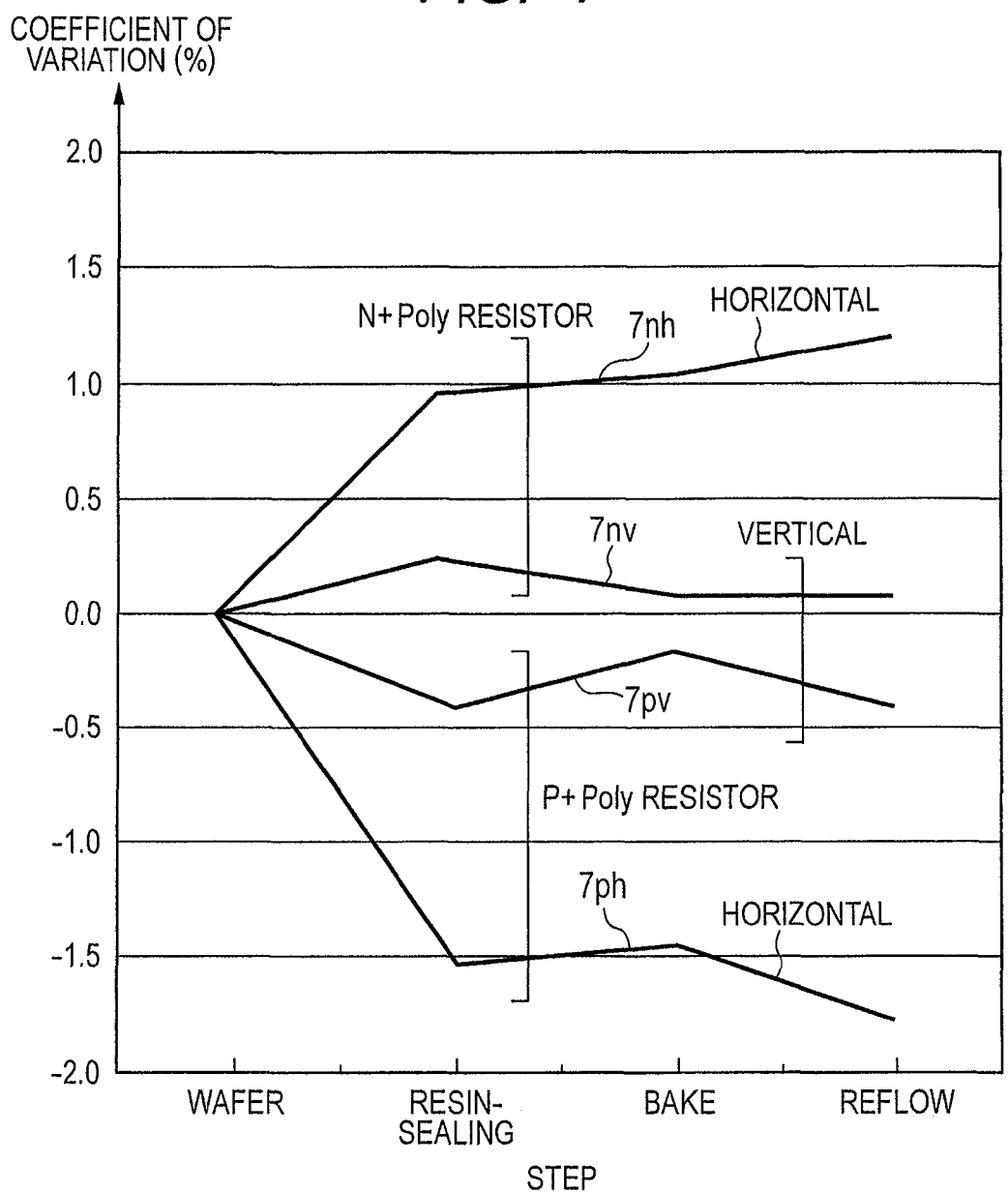

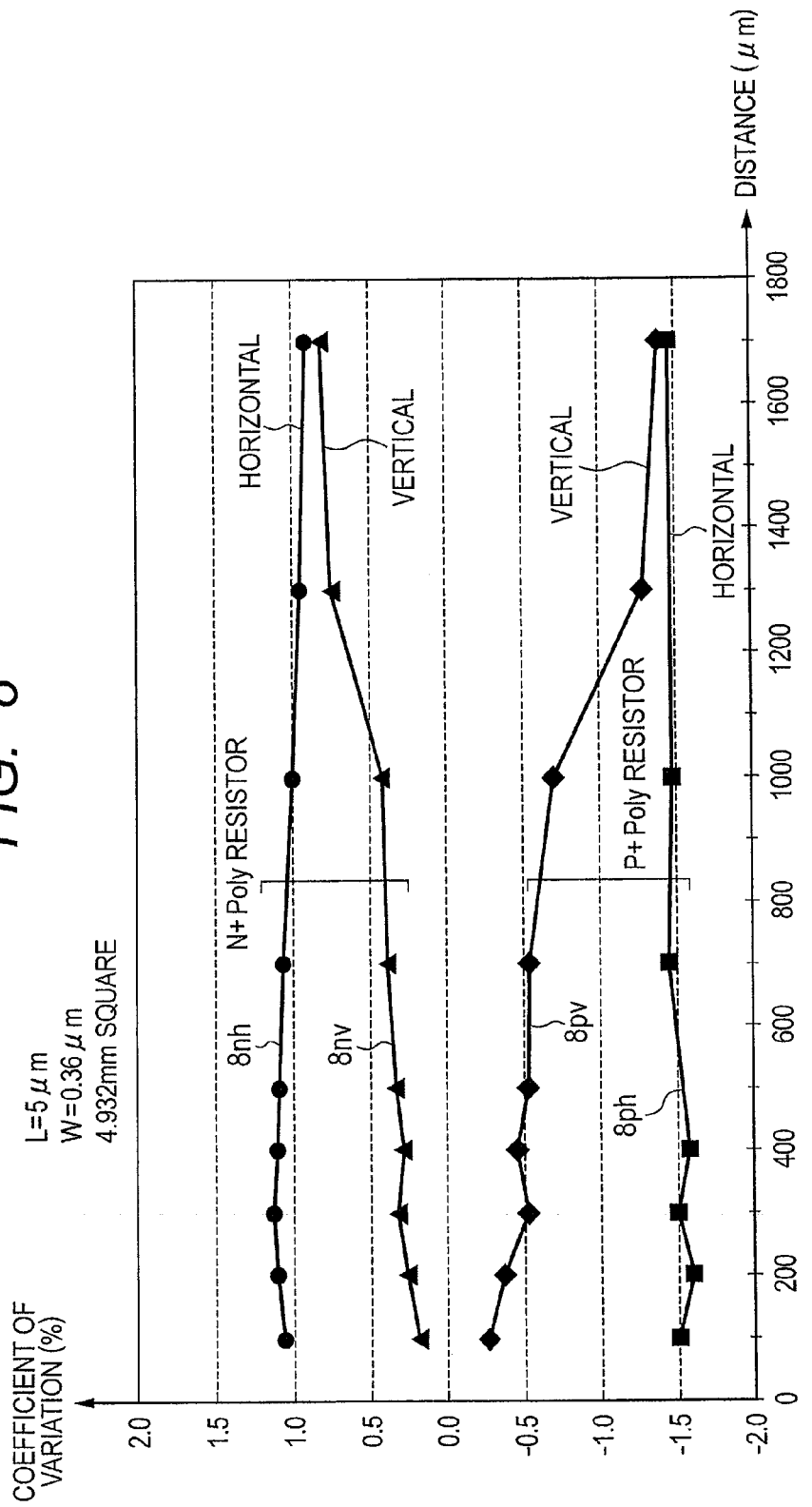

SEMICONDUCTOR DEVICE

CROSS-REFERENCE TO RELATED APPLICATIONS

The disclosure of Japanese Patent Application No. 2012-101541 filed on Apr. 26, 2012 including the specification, drawings and abstract is incorporated herein by reference in its entirety.

BACKGROUND

The present invention relates to a semiconductor device, and, for example, to a semiconductor device including a polysilicon resistor.

An on-chip oscillator to be mounted in a semiconductor device is required to secure desired oscillation frequency accuracy under a preset operating condition (power supply voltage, operating temperature). A variation in a resistive element can be considered to be one of the factors by which the oscillation frequency of the on-chip oscillator is varied. The electrical property of a circuit element mounted in a semiconductor device, such as a resistor, is influenced by an error in the condition of manufacturing the semiconductor device, and accordingly the oscillation frequency also varies for every wafer and chip. In order to secure required oscillation frequency accuracy, trimming, by which a resistance value of every chip is adjusted, is generally performed for a semiconductor device in a wafer state.

On the other hand, it is known that a value of a diffused resistor mounted in a semiconductor device varies after a mold package process for resin-sealing a chip. Japanese Unexamined Patent Publication No. 1998-189875 (Patent Document 1) discloses that, in order to suppress a variation in a resistance value of a diffused resistor formed by introducing impurities into a silicon substrate, the variation being caused by a piezo-resistance effect, the diffused resistor is arranged, from the periphery toward the center of a chip main body, in an area within one-third of the distance between the periphery and the center thereof. Japanese Unexamined Patent Publication No. 1994-97368 (Patent Document 2) disclosed that, in order to prevent a variation in the property of an element, the variation being caused by a stress generated when a semiconductor chip is mold-sealed, a group of resistors and a group of transistors are arranged in the circumferential direction from the peripheral portion toward the center.

PATENT DOCUMENT

[Patent Document 1] Japanese Unexamined Patent Publication No. 1998-189875
[Patent Document 2] Japanese Unexamined Patent Publication No. 1994-97368

SUMMARY

When a trimming resistor for adjusting the property of a functional circuit is formed by a polysilicon resistor, the property thereof, which has been adjusted in a wafer stage, varies after a mold package process, and hence it is difficult to provide a semiconductor device having a required property. Other problems and new features will become clear from the description and accompanying drawings of the present specification.

According to one embodiment, a semiconductor device includes a functional circuit having a resistor formed by a plurality of polysilicon resistors, and in which the property of the functional circuit can be adjusted by trimming the resistor, and in which the polysilicon resistors are coupled in series or in parallel to each other and arranged in a direction perpendicular to one side of the semiconductor device.

Advantage of the Invention

According to the one embodiment, a semiconductor device can be provided, in which the property of a functional circuit, which has been adjusted by trimming a resistor, can be maintained after a mold package process.

BRIEF DESCRIPTION OF THE DRAWINGS

FIGS. 3A and 3B are circuit views of a current generating circuit and a resistor according to First Embodiment;
FIG. 7 is a graph explaining a coefficient of resistance variation in the polysilicon resistor according to First Embodiment, occurring when a direction in which the polysilicon resistor is arranged is changed;
FIG. 8 is a graph explaining a coefficient of resistance variation in the polysilicon resistor according to First Embodiment, occurring when a place where the polysilicon resistor is arranged is changed.

DETAILED DESCRIPTION

Figure 1:
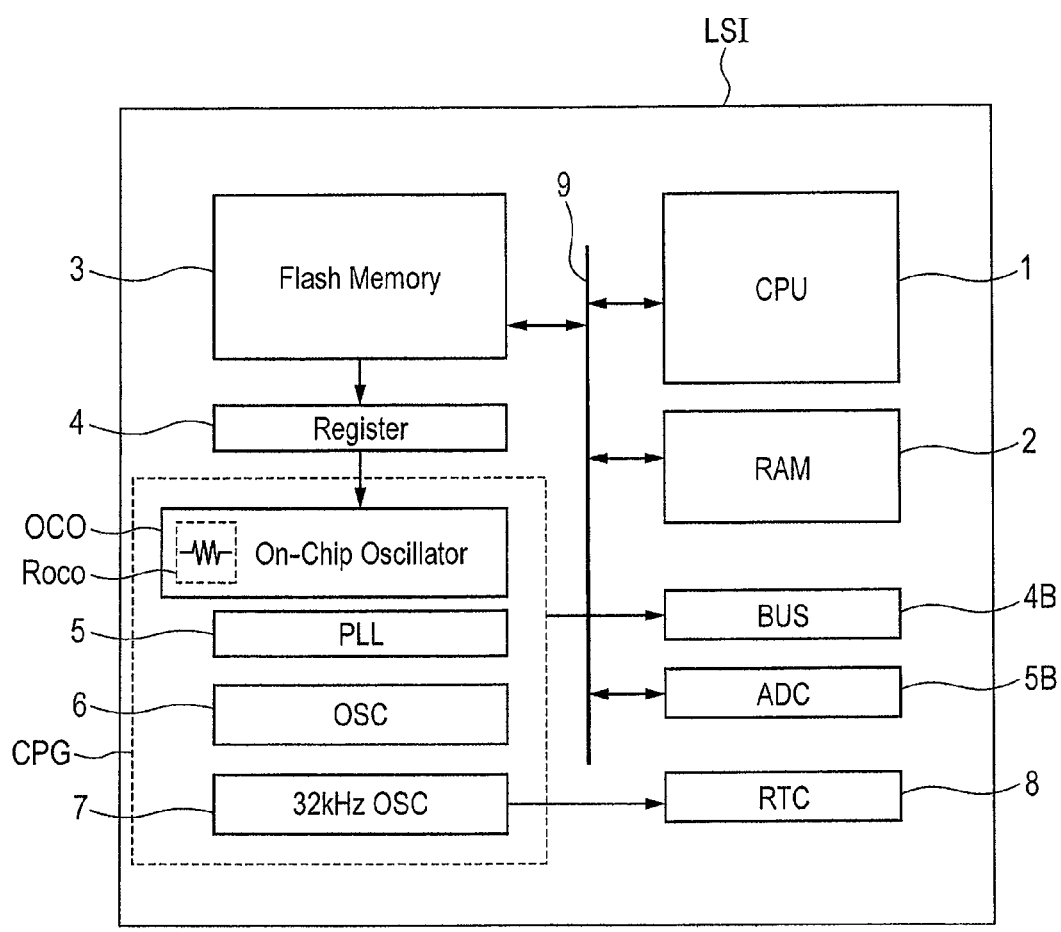
FIG. 1 is a view illustrating the structure of a semiconductor device according to First Embodiment.

Hereinafter, preferred embodiments will be described with reference to the accompanying drawings. When the number of pieces and quantity are mentioned in the description of the preferred embodiments, the preferred embodiments are not necessarily limited to the number of pieces and quantity, unless otherwise indicated. In the drawings of the preferred embodiments, like reference symbols and numerals are intended to indicate the same or similar parts. In the description of the preferred embodiments, duplicative description of the parts denoted with like reference symbols, etc., may not be repeated.

First Embodiment

With reference to FIG. 1, the structure of a semiconductor device LSI according to First Embodiment will be described.

The semiconductor device LSI includes a CPU (Central Processing Unit) 1, a RAM (Random Access Memory) 2, a flash memory 3, a register 4, a bus control circuit 4B, an AD converter 5B, a real-time clock 8, a clock generating circuit CPG, and a bus 9. The clock generating circuit CPG has an on-chip oscillator OCO, a PLL circuit 5, an oscillator circuit OSC, and a 32-kHz oscillator circuit 7. When a crystal oscillator (not illustrated) is externally attached to the 32-kHz oscillator circuit 7, the real-time clock 8 can be made to work.

The on-chip oscillator OCO has a resistor Roco. By adjusting the value of the resistor Roco with trimming, the oscillation frequency of the on-chip oscillator OCO is set to a desired value for every individual chip (semiconductor device LSI) formed over a wafer. The data necessary for the trimming is written into the flash memory 3, and the structure (resistance value) of the resistor Roco is electrically changed based on the data read out via the register 4.

Figure 2:
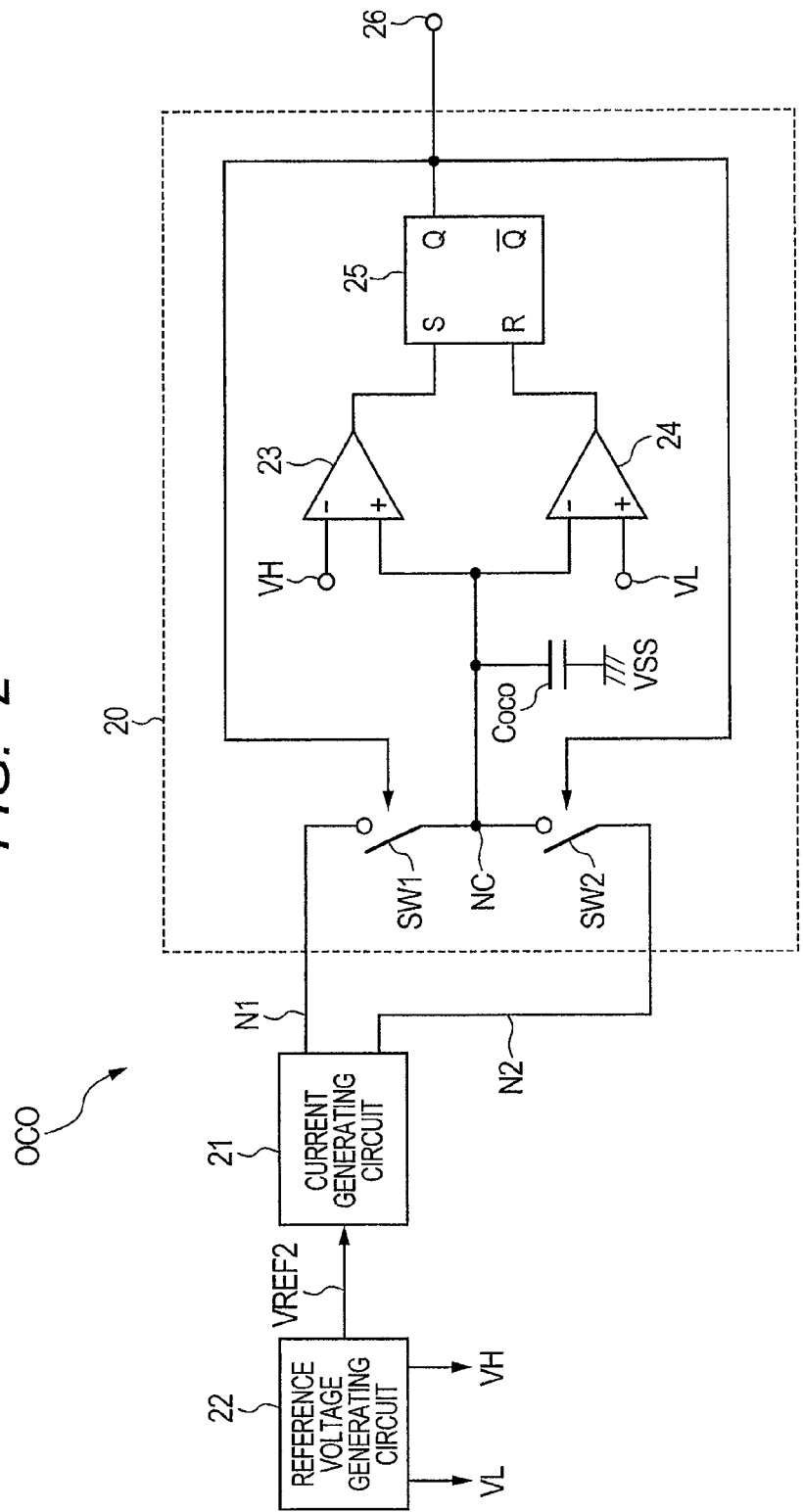
FIG. 2 is a circuit view of an on-chip oscillator according to First Embodiment.

With reference to FIG. 2, the circuit structure of the on-chip oscillator OCO according to First Embodiment will be described.

The on-chip oscillator OCO has a relaxation oscillator 20, a current generating circuit 21, and a reference voltage generating circuit 22. The reference voltage generating circuit 22 respectively outputs a reference voltage VL and a reference voltage VH to the relaxation oscillator 20 and a reference voltage VREF2 to the current generating circuit 21. The current generating circuit 21 supplies a current to the relaxation oscillator 20 through an output N1, and draws a current in the relaxation oscillator 20 through an output N2.

The relaxation oscillator 20 has comparators 23 and 24. The reference voltage VH is applied to an inverted input terminal of the comparator 23, and one end of a capacitance Coco is coupled to a non-inverted input terminal thereof. The reference voltage VL is applied to a non-inverted input terminal of the comparator 24, and the one end of the capacitance Coco is coupled to an inverted input terminal thereof. A power supply voltage VSS is applied to the other end of the capacitance Coco. An output of the comparator 23 is coupled to a set input of an RS-type flip-flop 25, and an output of the comparator 24 is coupled to a reset input of the RS-type flip-flop 25.

The one end of the capacitance Coco, one end of a switch SW1, and one end of a switch SW2 are coupled to a node NC. The other end of the switch SW1 is coupled to a node N1, and the other end of the switch SW2 is coupled to a node N2. The switches SW1 and SW2 are complementarily opened and closed by an output of the RS-type flip-flop 25, thereby allowing the capacitance Coco to be charged and discharged by the current generating circuit 21. The oscillation frequency of the relaxation oscillator 23 is determined by a current flowing through the outputs N1 and N2 of the current generating circuit 21, the capacitance Coco, the reference voltage VH, and the reference voltage VL.

Figures 3A, 3B:
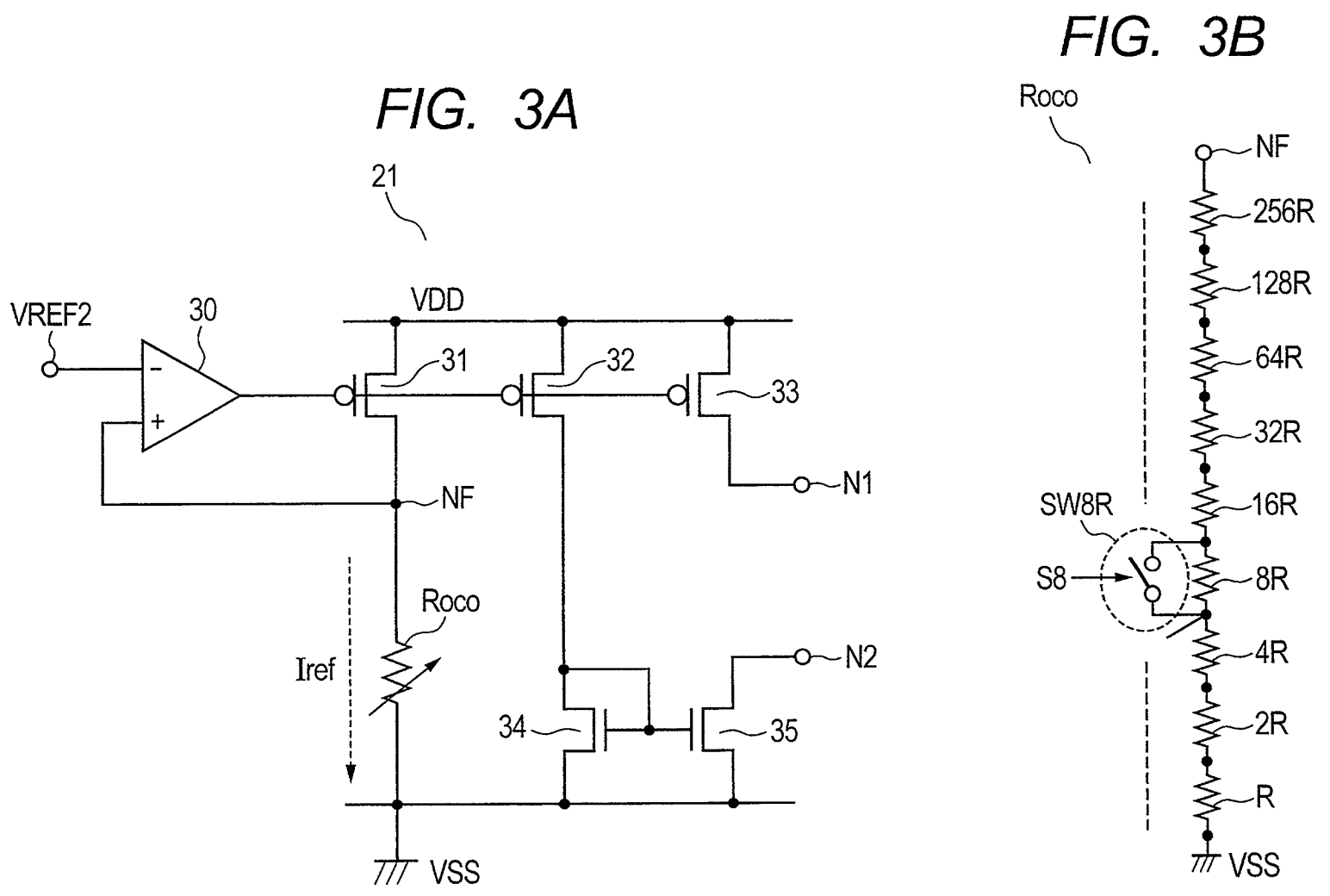

With reference to FIGS. 3A and 3B, the circuit structures of the current generating circuit 21 and the resistor Roco according to First Embodiment will be described.

The current generating circuit 21 illustrated in FIG. 3A has a differential amplifier 30, the resistor Roco, p-type transistors 31, 32, and 33, and n-type transistors 34 and 35. The reference voltage VREF2 is applied to an inverted input terminal of the differential amplifier 30, and a voltage at a node NF is applied to a non-inverted input terminal thereof. An output of the differential amplifier 30 is applied to a gate of each of the p-type transistors 31, 32, and 33, and a power supply voltage VDD is applied to a source of each of them.

One end of the resistor Coco is coupled to a drain of the p-type transistor 31 and the other end thereof is applied with the power supply voltage VSS.

The p-type transistor 31 and the resistor Roco are coupled in series to each other between a power supply wiring VDD (symbol of VDD means a power supply voltage and a power supply wiring, the same hereinafter) and a power supply VSS (symbol of VSS means a power supply voltage and a power supply wiring, the same hereinafter) through the node NF. A constant current Iref determined by the reference voltage VREF2 and the value of the resistor Roco flows through the resistor Roco. A gate of the n-type transistor 34 is coupled to a drain thereof, and a source is applied with the power supply voltage VSS. A gate of the n-type transistor 35 is coupled to the gate of the n-type transistor 34, and a source thereof is applied with the power supply voltage VSS. That is, the p-type transistors 32 and 33 and the n-type transistors 34 and 35 form a current mirror circuit.

A current, proportional to the constant current Iref flowing through the resistor Roco, flows through outputs N1 and N2 of the current mirror circuit. A current flowing out of the output N1 charges the capacitance Coco in FIG. 2, and a current flowing in the output N2 discharges the capacitance Coco, thereby allowing the on-chip oscillator OCO to oscillate at a desired frequency.

The resistor Roco illustrated in FIG. 3B has a structure in which a resistor R, a resistor 2R, . . . , a resistor 256R are coupled in series to each other. The resistor 2R has a value two times larger than that of the resistor R, and the relationship between the resistor R and each of the other resistors is the same as that. A switch is coupled at both ends of each resistor in parallel therewith. For example, a switch SW8R is coupled in parallel to the resistor 8R, and opening and closing of the switch SW8R are controlled by a signal S8. This signal S8 and a signal by which opening and closing of a switch (not illustrated), which is coupled to each of the other resistors in parallel therewith, is controlled, are controlled based on data stored in the resister 4 illustrated in FIG. 1. Trimming of the resistor Roco is performed based on the data, and the value of the resistor Roco is adjusted such that the on-chip oscillator OCO outputs a clock having a desired oscillation frequency.

Because the clock generated in the on-chip oscillator OCO is applied to a wide range of applications, the clock is required not to vary with power supply and temperature. For example, the on-chip oscillator OCO to be mounted in a 160 nm process microcomputer is required that a variation in the oscillation frequency should be approximately ±3% or less over a wide range in which a power supply voltage is 1.8 V to 5.5 V and operating temperature is −40° C. to 125° C. In particular, for the on-chip oscillator OCO required to have an oscillation frequency with high accuracy, it is required that a variation in the oscillation frequency should be ±1% or less.

When represented by a value of a circuit element and a voltage, the oscillation frequency of the on-chip oscillator OCO illustrated in FIG. 2 is represented as follows:

$$F=VREF2/(VH-VL)*1/CR \qquad \text{Equation 1}$$

wherein C is a value of the capacitance Coco, R is a value of the resistor Roco, symbol "/" means division, and symbol "*" means multiplication, respectively. As represented in Equation 1, the oscillation frequency F is inversely proportional to the multiplied value of the capacitance Coco and the resistor Roco. Accordingly, it becomes possible to achieve a target oscillation frequency F by adjusting a value of the resistor Roco with trimming.

Figure 4:
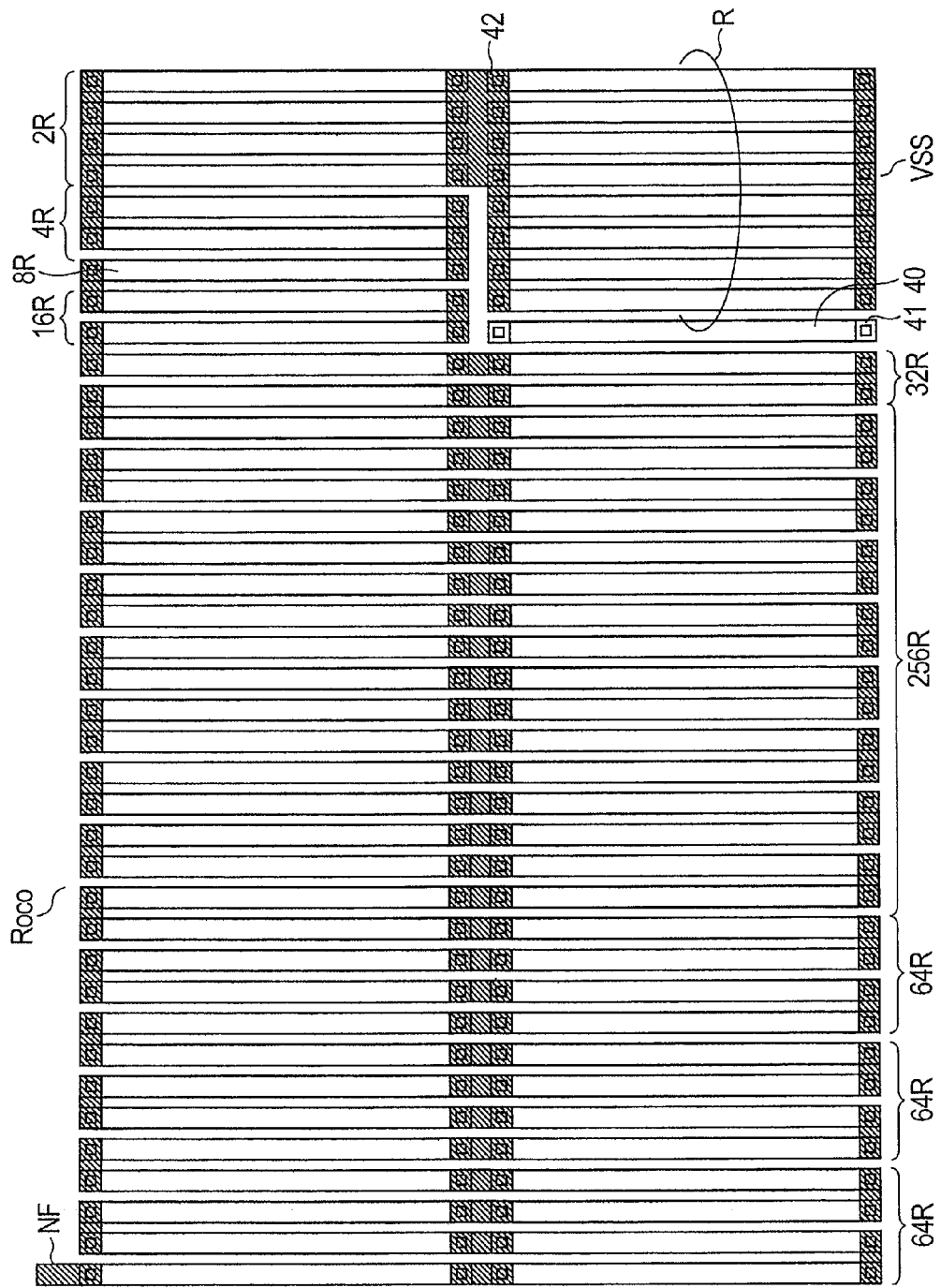
FIG. 4 is a layout view of the resistor according to First Embodiment.

With reference to FIG. 4, the layout of the resistor Roco will be described. The resistor Roco is formed by arranging basic resistor patterns 40 in series or in parallel to each other. The resistor pattern 40 indicates polysilicon formed into a rectangular shape, and contacts 41 are formed at both ends thereof. One resistor pattern 40 and another resistor pattern 40 are coupled together by a wiring layer via the contact 41. In FIG. 4, 8 resistor patterns 40, by which the resistor R located on the lower right side is formed, are coupled in parallel to each other, and one end of each of the resistor patterns 40 is coupled to the power supply wiring VSS. One end of the resistor pattern 40 located on the upper left side is coupled to the node NF. Because it is needed in trimming to increase or decrease a value of the resistor Roco, some resistor patterns are inserted as a spare for the resistor 64R.

It becomes possible to achieve an oscillation frequency with high accuracy by using a metal resistor having a high Young's modulus, such as titanium nitride (TiN) and tungsten (W), instead of forming the resistor Roco by polysilicon. However, a mask for exposing a wafer and additional manufacturing steps, which are needed for forming the metal resistor, are required, and further there is the problem that the pattern area of the metal resistor is increased due to the lower resistivity thereof. On the other hand, in the case of the on-chip oscillator OCO according to First Embodiment, the resistor Roco is formed by polysilicon that is used in forming other circuit elements, such as a transistor, the step of manufacturing the wafer is not complicated. Further, because the resistivity of polysilicon is high, the pattern area of the resistor Roco can be more reduced than that of a metal resistor. In order to adjust the resistivity of the polysilicon resistor, p-type or n-type impurities are ion-implanted into the polysilicon formed over the wafer.

The present applicant has studied that the aforementioned polysilicon resistor might be adopted as a trimming resistor for adjusting the property of a circuit formed over the wafer to a desired value. A polysilicon resistor has good consistency with a process for forming an element, such as a transistor, and contributes to a reduction in a chip area. However, when a chip in which the oscillation frequency of the on-chip oscillator OCO has been adjusted to a desired value by trimming the resistor Roco formed by polysilicon resistors, is resin-sealed, the oscillation frequency thereof varies. This variation in the oscillation frequency is caused because the properties of the resistor Roco and the capacitance Coco vary due to a mold package process (a series of steps from resin-sealing to reflow). In particular, in a polysilicon resistor forming the resistor Roco, the absolute value of the resistance and the temperature coefficient vary before and after the mold package process. It is believed that this variation is caused, as one factor, by a stress applied to the chip during the mold package process.

In order to achieve, with polysilicon, a trimming resistor by which the property of a circuit, such as the on-chip oscillator OCO, is adjusted, it is essential to suppress a variation in the property of a polysilicon resistor, occurring due to the mold package process. The present applicant has acquired the following knowledge by measuring variations in the resistance values of polysilicon resistors in each of the mold package process. That is, the applicant has acquired a condition in which polysilicon can be adopted as a trimming resistor by appropriately setting an arrangement area, orientation, and shape, etc., of the polysilicon.

Figure 5A:
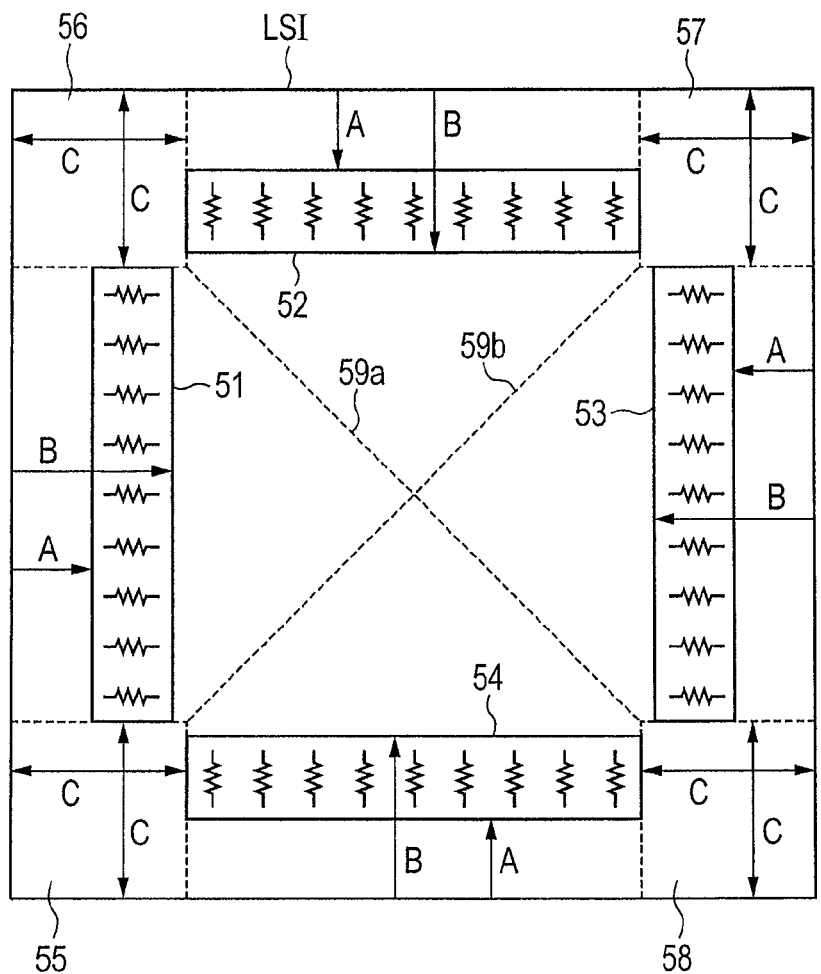
FIGS. 5A and 5B are layout views illustrating an arrangement area for a polysilicon resistor according to First Embodiment.

With reference to FIG. 5A, an arrangement area for the polysilicon resistor according to First Embodiment will be described. FIG. 5A schematically illustrates the layout of the semiconductor device LSI. The semiconductor device LSI has a rectangular shape, and more preferably has a square shape. Hereinafter, four sides of a rectangular shape illustrated as the semiconductor device LSI means cut sides formed by individually cutting out, with dicing, a plurality of chips formed over a wafer. This cut side is sometimes described as a "chip side".

The semiconductor device LSI has arrangement areas 51, 52, 53, and 54 for the polysilicon resistors, and arrangement prohibited areas 55, 56, 57, 58, 59a, and 59b. The borderlines of each of the arrangement areas, which are parallel to a chip side, are defined within a region of, from the chip side toward the inside, a distance A or more to a distance B or less. Hereinafter, the borderlines located at the distance A and at the distance B are also described as an "outside arrangement borderline A" and an "inside arrangement borderline B", respectively. In each of the arrangement areas, the borderline perpendicular to the corresponding chip side is defined by the borderline with the arrangement prohibited area, but it is desirable that both the borderlines perpendicular to the chip side are set to be nearer to the center of the chip side. The arrangement prohibited areas 59a and 59b are set to be on the diagonal lines of the semiconductor device LSI. The arrangement prohibited areas 55 to 58 are formed at four corners of the semiconductor device LSI, each of which is defined as a square area whose one side has a length of a distance C. Detail of the distances, A, B and C will be described later.

Figure 5B:
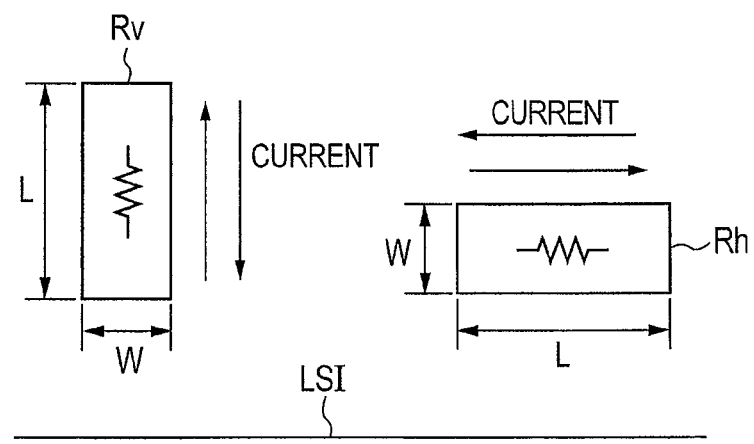

With reference to FIG. 5B, the orientation of the polysilicon resistor in First Embodiment will be described. It is assumed that: a polysilicon resistor Rv has a rectangular shape having a size of W in width×L in length; and a current flows in a direction perpendicular to a chip side of the semiconductor device LSI. Similarly, a current flowing through a polysilicon resistor Rh is assumed to flow in a direction parallel to the chip side. In this case, it is defined that the polysilicon resistor Rv and the polysilicon resistor Rh are arranged to be perpendicular to the chip side and to be parallel thereto, respectively.

Each of the arrangement areas in FIG. 5A represents an area where the value of the polysilicon resistor arranged therein hardly varies before and after the mold package process. The direction of the polysilicon resistor arranged in this arrangement area is set to be perpendicular to a chip side. The arrangement prohibited area represents an area where the value of the polysilicon resistor arranged therein greatly varies before and after the mold package process. A polysilicon resistor required to have a highly-accurate value, such as the resistor Roco by which the constant current Iref (FIG. 3A) of the on-chip oscillator OCO is determined, should not be arranged in the arrangement prohibited area.

Figure 6A:
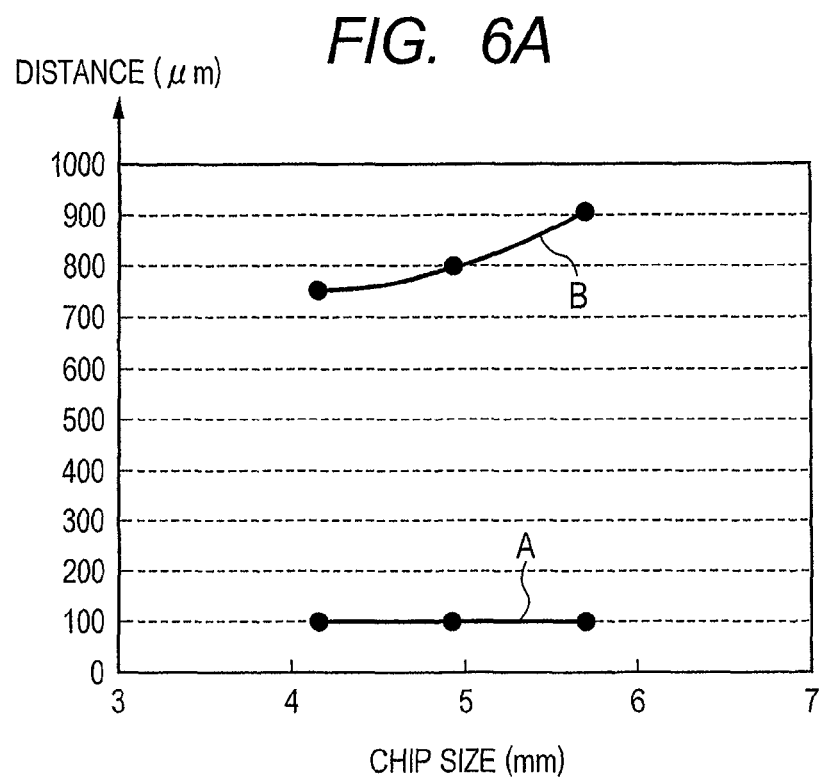
FIGS. 6A and 6B are views illustrating a specific example of the arrangement area for the polysilicon resistor according to First Embodiment.
Figure 6B:
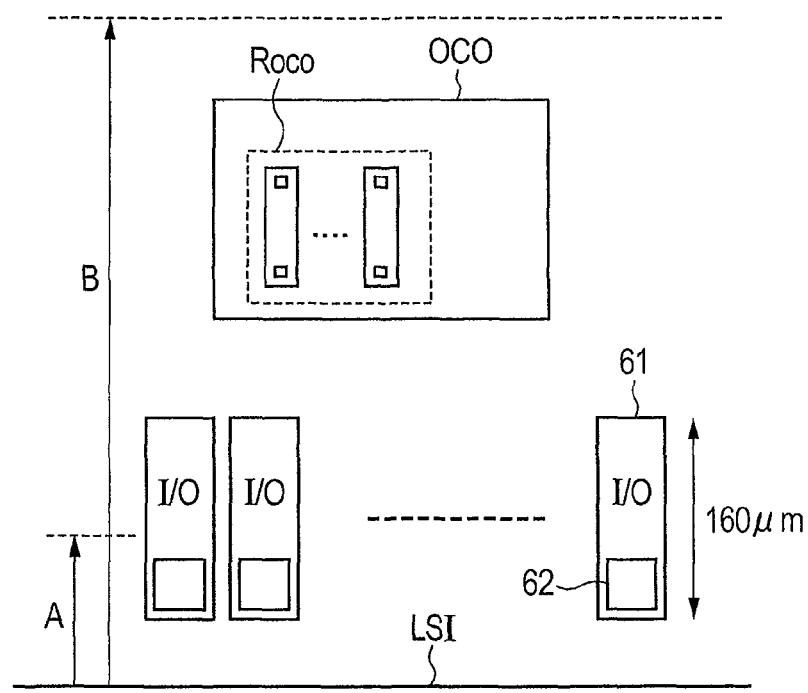

With reference to FIGS. 6A and 6B, a specific example of the arrangement area for the polysilicon resistor will be described. FIG. 6A shows the results of experiments carried out by the present Applicant. The horizontal axis represents the length (chip size) of one side of the semiconductor device LSI, while the vertical axis represents the values of the outside arrangement borderline A and the inside arrangement borderline B. It has been known that, when the chip size is one of 4.15 mm, 4.932 mm, and 5.70 mm, the value of the outside arrangement borderline A is desirably set to be 100 μm, irrespective of chip size. Also, it has been known that the value of the inside arrangement borderline B is increased with an increase in the chip size and is desirably set to be 750 μm, 800 μm, and 900 μm.

FIG. 6B illustrates an example of the arrangement of the on-chip oscillator OCO. An I/O cell (I/O buffer) 61 including a pad 62 that is to be coupled to a lead wiring of the package by a metal wiring, such as a bonding wire, is arranged near to one chip side of the semiconductor device LSI. The resistor Roco included in the on-chip oscillator OCO is a polysilicon resistor for trimming, and is arranged, between the outside arrangement borderline A and the inside arrangement borderline B, in a direction perpendicular to the chip side.

With reference to FIG. 7, a coefficient of resistance variation in the polysilicon resistor, occurring when a direction in which the polysilicon resistor is arranged is changed, will be described.

The horizontal axis represents the steps at which the resistance value of the polysilicon resistor is measured. The "wafer" means that the resistance thereof is measured in a wafer state before the mold package process. The "resin-sealing", "bake", and "reflow" mean ordinary steps in the mold package process, respectively. The vertical axis represents a coefficient of resistance variation (hereinafter, also and simply described as a "coefficient of variation") measured in each of the aforementioned steps in the mold package process, based on the resistance value of the polysilicon resistor in the wafer state. The "horizontal" or "vertical" means, with respect to the chip side, a direction in which the polysilicon resistor is arranged. The "N+Poly resistor" or "P+Poly resistor" means a polysilicon resistor into which a high concentration of N-type impurities or P-type impurities have been doped. The polysilicon resistor to be measured is arranged at a position 300 μm away from the center of the chip side.

Dependency of a coefficient of resistance variation in the polysilicon resistor on a direction in which the resistor is arranged will be studied. The graph Inv shows coefficients of variation in the values of the N+Poly resistor arranged in the vertical direction. The resistance value is increased by 0.2 to 0.3% after the resin-sealing step, and the increase becomes approximately 0.1% after the reflow step. The graph 7nh shows coefficients of variation in the values of the N+Poly resister arranged in the horizontal direction. The resistance value is increased to nearly 1% after the resin-sealing step, and finally increased to approximately 1.3%. The graph 7pv shows coefficients of variation in the values of the P+Poly resistor arranged in the vertical direction. The resistance value is decreased by approximately 0.4% after the reflow step. The graph 7ph shows coefficients of variation in the values of the P+Poly resistor arranged in the horizontal direction. The resistance value is decreased to approximately 1.7 to 1.8%.

It has been known that positive/negative of the coefficient of variation depends on a conductive type (n-type/p-type) of the impurities doped into the polysilicon resistor and there is a great difference between the coefficients of variation occurring when a direction in which the polysilicon resistor is arranged is changed. It has been known that, by arranging the polysilicon resistor in a direction perpendicular to the chip side, the coefficient of variation, occurring after the reflow step, can be suppressed to be within a range of 0.1% (doped with n-type impurities) to 0.4% (doped with p-type impurities). Accordingly, it is preferable to arrange the polysilicon resistor in a direction perpendicular to the chip side.

With reference to FIG. 8, a coefficient of resistance variation in the polysilicon resistor, occurring when a place where the polysilicon resistor is arranged is changed, will be described.

The horizontal axis represents a distance at which the polysilicon resistor is arranged, based on the chip side. The vertical axis represents a coefficient of resistance variation measured after the reflow step, based on the value of the polysilicon resistor in the wafer state. The shape of the polysilicon resistor is a rectangle pattern having a size of 0.36 in width×5 μm in length, and the semiconductor device LSI in which the polysilicon resistor is formed has a square shape whose one side is 4.932 mm long.

The graphs 8nv and 8pv show coefficients of resistance variation in the polysilicon resistor arranged in the vertical direction. Taking into consideration that the range of variation in the oscillation frequency of the on-chip oscillator OCO is required to be ±1% or less, in the case of the polysilicon resistor into which n-type impurities have been doped, it is needed that a distance at which the polysilicon resistor is to be arranged is set to be within a range of 100 μm to 800 μm and a coefficient of resistance variation in the polysilicon resistor, from a wafer state (i.e., a state where trimming has been completed) to a state after the mold package process, is suppressed to be approximately ±0.5% or less. Accordingly, it is preferable that the polysilicon resistor arranged in a direction perpendicular to the chip side is arranged within a range of approximately 100 μm to 800 μm from the chip side. Further, it is preferable to arrange the polysilicon resistor near to the center of the chip side.

Figure 9A:
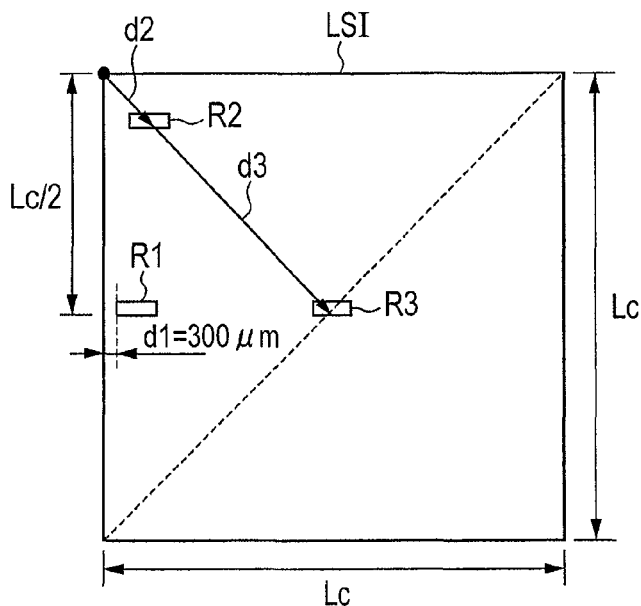
FIG. 9A is a view and FIG. 9B is a graph both explaining a coefficient of resistance variation in the polysilicon resistors arranged at a corner portion and a center portion of the semiconductor device according to First Embodiment.
Figure 9B:
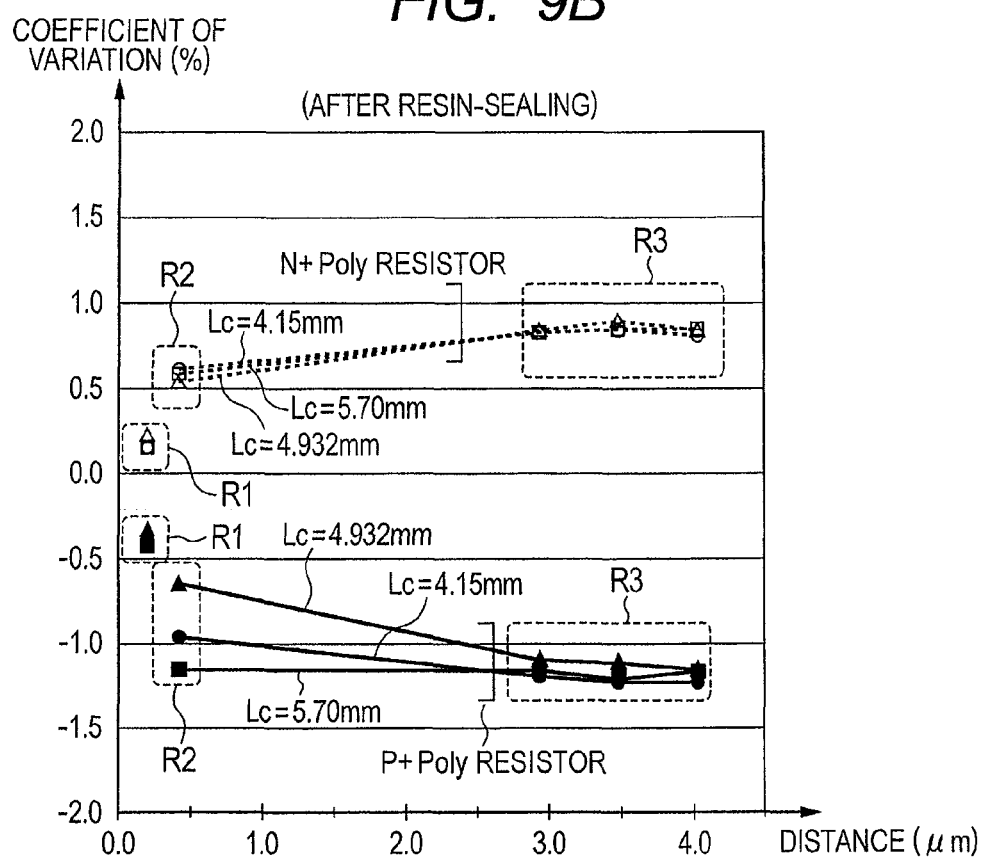

With reference to FIGS. 9A and 9B, a coefficient of resistance variation in the polysilicon resistor arranged at a corner portion and a center portion of the semiconductor device LSI will be described.

FIG. 9A illustrates positions of: a polysilicon resistor R2 arranged at the upper left corner portion of the semiconductor device LSI; and a polysilicon resistor R3 arranged at the center portion thereof. The semiconductor device LSI has a square shape whose one side is L-cm long. Based on the upper left corner of the semiconductor device LSI, the polysilicon resistor R2 is arranged at a position d2 away therefrom, while the polysilicon resistor R3 is arranged at a position d3 away therefrom. A polysilicon resistor R1 for comparison is arranged at a position d1 away from the center of the left side of the semiconductor device LSI. Each of the polysilicon resistors R1 to R3 is arranged in a direction perpendicular to the chip side on the left side of the semiconductor device LSI.

FIG. 9B shows a coefficient of resistance variation in each of the aforementioned resistors R1 to R3 arranged in each of the semiconductor devices LSI whose one side Lc is 4.15-mm long, 4.932-mm long, and 5.70-mm long. A resistance value of each of the resistors R1 to R3 is measured after the resin-sealing, and the basis of the coefficients of resistance variation is a resistance value of each of the resistors R1 to R3 in the wafer state. The resistor R1 is arranged in the arrangement area for resistor, and is measured for the comparison with the measurement results of the resistors R2 and R3. The value of the resistor R1 is hardly dependent on the value of the chip size Lc, and the coefficient of variation is approximately 0.2% to 0.3% (in the case of N+Poly resistor).

The value of the resistor R2 arranged at a corner portion d2 (=4 mm) away from the corner of the semiconductor device LSI is hardly dependent on the value of the chip size Lc; however, the coefficient of variation is 0.5% to 0.6%, which is two times larger than that of the resistor R1 (in the case of N+Poly resistor). If the resistor Roco in the on-chip oscillator OCO is arranged in this area, a decrease in the oscillation frequency accuracy may be caused. Accordingly, it is preferable that a corner portion is set to be an arrangement prohibited area where it is prohibited to arrange the polysilicon resistor.

The value of the resistor R3 arranged at the center portion of the semiconductor device LSI is hardly dependent on the value of the chip size Lc, and the coefficient of variation is approximately 0.7% (in the case of N+Poly resister). Accordingly, it is preferable that each of the center portion and a position located on the diagonal lines is also set to be an arrangement prohibited area for the polysilicon resistor, similarly to the corner portion.

Figure 10:
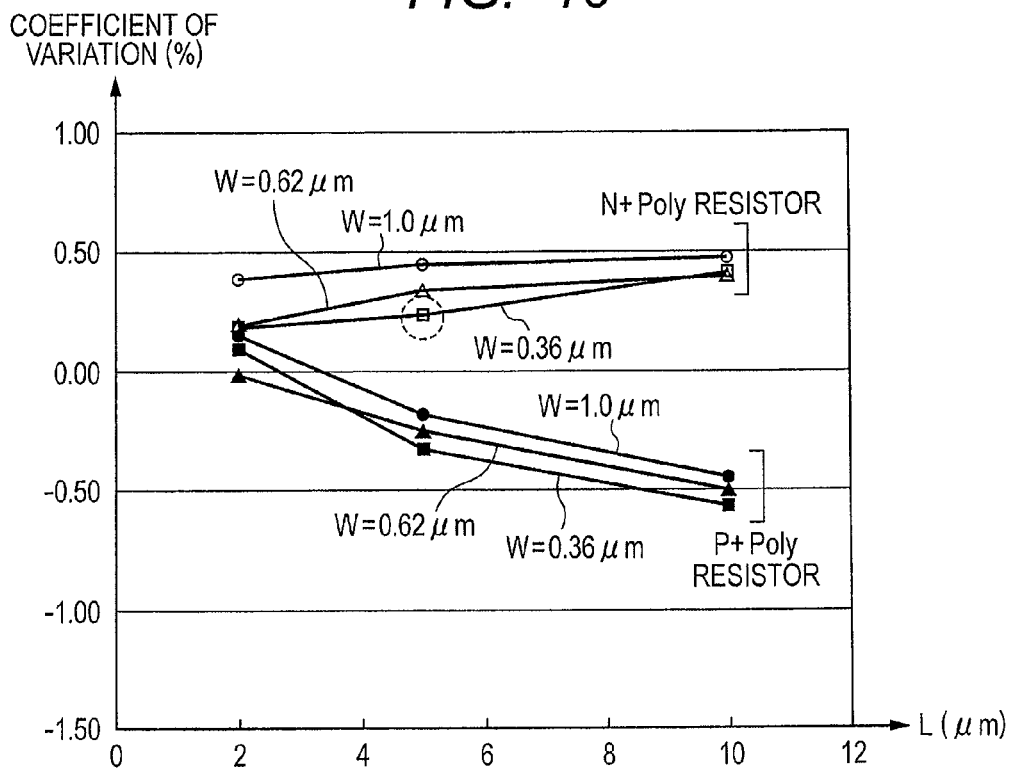
FIG. 10 is a graph explaining a change in the coefficients of resistance variation in the polysilicon resistor according to First Embodiment, occurring when the length thereof is changed.

With reference to FIG. 10, a change in the coefficients of resistance variation in the polysilicon resistor, occurring when the length thereof is changed, will be described.

The horizontal axis represents the length L of the polysilicon resistor, while the vertical axis represents a coefficient of resistance variation measured after the resin-sealing, based on the measured value in the wafer state. The measured polysilicon resistor is arranged at a position 300 μm away from the center of the chip side and perpendicularly with respect to the chip side. The coefficient of variation is more decreased as the length L of the polysilicon resistor becomes smaller. Further, the coefficient of variation tends to be more decreased as the width W of the polysilicon resistor is smaller. This is because, as the width and length of the polysilicon resistor become smaller, respectively, the polysilicon resistor is more hardly influenced by a stress occurring due to the mold package process. On the other hand, the change in the coefficients of resistance variation in the N+Poly resistor is smaller than that in the P+Poly resistor. This is because, the concentration of impurities in the N+Poly resistor is higher than that of the P+Poly resistor, and hence the piezo-resistance coefficient of the N+Poly resistor is smaller than that of the P+Poly resistor.

The resistor Roco in the on-chip oscillator OCO is formed by arranging a plurality of basic polysilicon resistors in series or in parallel to each other, so that the resistance value of the resistor Roco can be adjusted by trimming. For example, by making the polysilicon resistor to have a width W of 0.36 μm and a length L of 5.0 μm, a decrease in the oscillation frequency accuracy, occurring due to a change in the resistance values resulting from the aforementioned stress, can be suppressed. The area of this resistor is smaller than that of a resistive element to be used in an ordinary analog circuit (e.g., width×length is 1 μm×10 μm or 0.56 μm×28 μm).

Advantages of the semiconductor device LSI according to First Embodiment will be described. A trimming resistor for adjusting the property of a functional circuit packed in a functional unit, such as the on-chip oscillator OCO, is formed by a plurality of polysilicon resistors, and each of the polysilicon resistors is arranged in a direction perpendicular to the chip side. By defining the direction, in which the polysilicon resistor for trimming is oriented, in such a way, the property (oscillation frequency) of the functional circuit, which has been adjusted by trimming in a wafer stage, can also be maintained within a range in which no problem is caused in practical use, after the mold package process performed subsequently.

The polysilicon resistor for trimming is arranged in a direction perpendicular to one chip side and between an outside arrangement borderline and an inside arrangement borderline respectively set at predetermined distances from the chip side. It is more preferable to arrange it near to the center portion of the chip side. Thereby, a variation in the property of the functional circuit, which has been adjusted by trimming, can be further suppressed. The polysilicon resistor for trimming should not be arranged at each corner portion (4 corners) and further on the diagonal lines of the semiconductor device LSI. Thereby, it can be prevented that the property of the functional circuit, which has been adjusted by trimming after the mold package process, may not meet a required specification.

First Variation of First Embodiment

Figure 11:
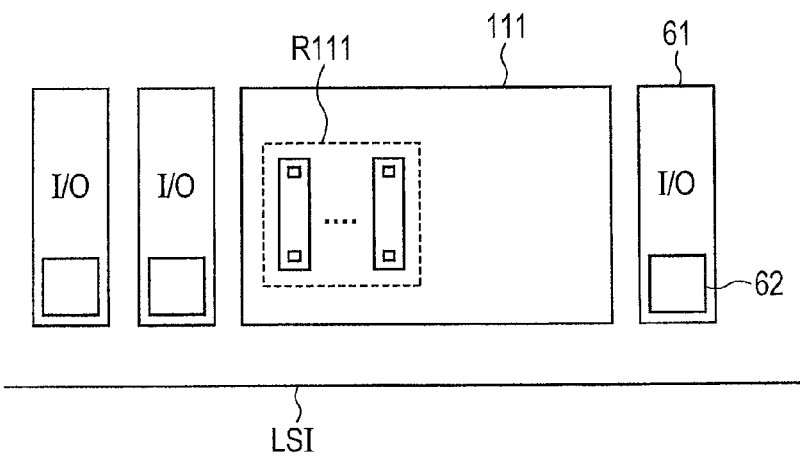
FIG. 11 is a view explaining the structure of a semiconductor device according to First Variation of First Embodiment.

With reference to FIG. 11, the structure of a semiconductor device LSI according to First Embodiment will be described.

FIG. 11 illustrates an example in which an on-chip oscillator 111 is arranged in an area (hereinafter, described as an "I/O cell region") where an I/O cell 61 is arranged. When the semiconductor device LSI is a microcomputer designed with 160-nm node, the height of the I/O cell 61 is approximately 160 μm. This area is located near to the outside arrangement borderline A of 100 μm, and accordingly a decrease in the oscillation frequency accuracy, occurring due to a stress in a trimming resistor R111 comprised of the polysilicon resistors, can be suppressed.

Second Variation of First Embodiment

Figure 12:
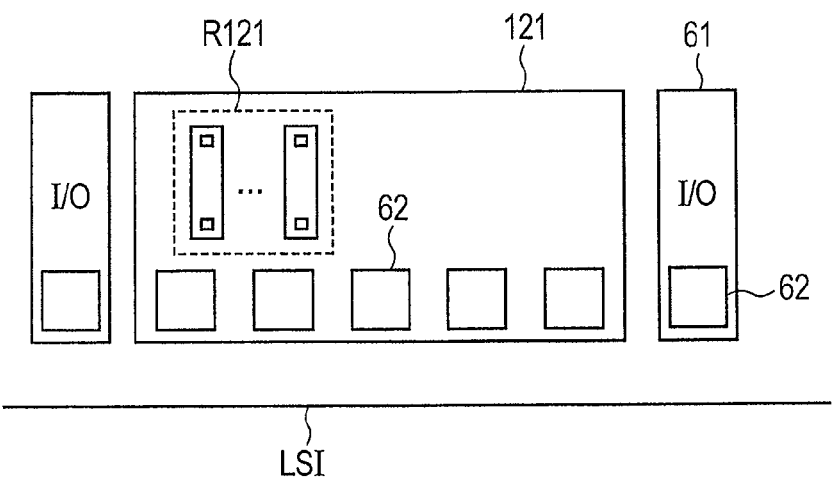
FIG. 12 is a view explaining the structure of a semiconductor device according to Second Variation of First Embodiment.

With reference to FIG. 12, the structure of a semiconductor device LSI according to Second Variation will be described.

FIG. 12 illustrates an example in which an on-chip oscillator 121, in which an I/O cell (not illustrated) is housed, is arranged in the I/O cell area. The on-chip oscillator 121 houses the I/O cell and a pad 62 thereof, and has both functions of an on-chip oscillator and an I/O cell. With this structure, a change in the resistance values, occurring due to a stress in a trimming resistor R121, can be suppressed, and layout design of power supply wirings, in which a countermeasure by which the on-chip oscillator 121 is not influenced by a power supply noise is taken into consideration, can be made easily. Further, by packing both the functions of an I/O cell and an on-chip oscillator in a single functional circuit, a dead space, occurring due to the design of a floor plan for element arrangement or a wiring layout, is hardly created, and an effect of reducing the area of the semiconductor device LSI can be exerted. Furthermore, by arranging the on-chip oscillator in the I/O cell area, the number of electrostatic protecting elements for on-chip oscillator can also be reduced, thereby allowing a synergetic effect of reducing area to be exerted.

Third Variation of First Embodiment

Figure 13:
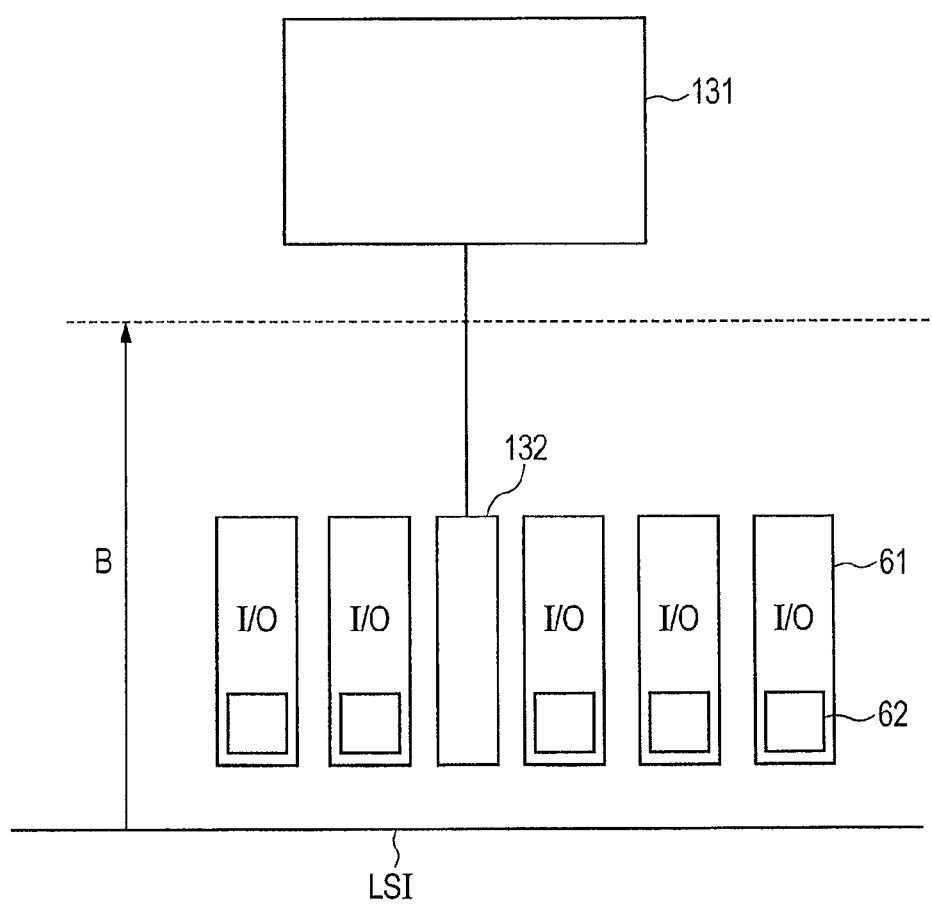
FIG. 13 is a view explaining the structure of a semiconductor device according to Third Variation of First Embodiment.

With reference to FIG. 13, the structure of semiconductor device LSI concerning variation 3 of First Embodiment is explained.

FIG. 13 illustrates an example in which: of the circuit elements that form an on-chip oscillator, resistors and capacitances, each of which is likely to be influenced by a variation in the property occurring due to a stress, are arranged in an area 132 provided in the I/O cell area; and other circuit elements are arranged in an area 131 provided further inside (toward the center of the chip) the inside arrangement borderline B. By arranging an on-chip oscillator separately in such a way, it becomes possible to suppress a decrease in oscillation frequency accuracy while flexibility in arrangement is being secured.

First Embodiment and the variations thereof are not limited to the on-chip oscillator OCO, but can be applied to functional circuits whose circuit property can be adjusted by trimming a polysilicon resistor in a wafer state. Such functional circuits can be exemplified by a flash type AD converter circuit, subranging type AD converter circuit, R-2R type DA converter circuit, and power supply circuit, etc.

It should be understood that the embodiments disclosed herein are exemplary in all points and do not limit the invention. The scope of the invention is defined not by the above description but by claims and it is intended that the scope of the invention includes equivalents of claims and all modifications within the scope of claims.

What is claimed is:

1. A semiconductor device comprising:
a functional circuit having a resistor formed by a plurality of polysilicon resistors,
wherein a property of the functional circuit can be adjusted by trimming the resistor, and
wherein the polysilicon resistors are coupled in series or in parallel to each other and arranged in a direction perpendicular to one side of the semiconductor device.

2. The semiconductor device according to claim 1,
wherein the semiconductor device includes four chip sides, and
wherein the polysilicon resistors are arranged perpendicular to one of the chip sides of the semiconductor device and arranged between an outside arrangement borderline and an inside arrangement borderline respectively set at predetermined distances from the one of the chip sides.

3. The semiconductor device according to claim 2,
wherein the polysilicon resistors are arranged at a center portion of the one of the chip sides.

4. The semiconductor device according to claim 2,
wherein the polysilicon resistors are arranged away from four corners of the four chip sides, and arranged outside of a square area set at a predetermined distance from the four chip sides.

5. The semiconductor device according to claim 4,
wherein the polysilicon resistors are further arranged away from diagonal lines of the four chip sides.

6. The semiconductor device according to claim 2,
wherein the functional circuit has an analog circuit, and
wherein the area of the polysilicon resistors is smaller than that of any one of resistors that the analog circuit has.

7. The semiconductor device according to claim 2,
wherein the functional circuit is an on-chip oscillator, and
wherein the oscillation frequency of the on-chip oscillator can be adjusted by trimming the resistor.

8. The semiconductor device according to claim 2, further comprising:
an I/O circuit,
wherein the polysilicon resistors are arranged in an area where the I/O circuit is arranged.

* * * * *